(12) United States Patent
Singleton et al.

(10) Patent No.: US 8,822,046 B2
(45) Date of Patent: Sep. 2, 2014

(54) STACK WITH WIDE SEED LAYER

(75) Inventors: Eric Walter Singleton, Maple Plain, MN (US); Jae-Young Yi, Prior Lake, MN (US); Konstantin Nikolaev, Bloomington, MN (US); Victor Boris Sapozhnikov, Minnetonka, MN (US); Stacey Christine Wakeham, Bloomington, MN (US); Shaun Eric McKinlay, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 94 days.

(21) Appl. No.: 13/460,058

(22) Filed: Apr. 30, 2012

(65) Prior Publication Data

US 2013/0288076 A1    Oct. 31, 2013

(51) Int. Cl.
G11B 5/39 (2006.01)
G01R 33/09 (2006.01)
H01L 43/12 (2006.01)
H01L 43/08 (2006.01)

(52) U.S. Cl.
CPC ............ G01R 33/093 (2013.01); G11B 5/3912 (2013.01); H01L 43/08 (2013.01); G11B 5/398 (2013.01); G11B 5/3932 (2013.01)
USPC ............... 428/811.5; 360/324.11; 360/324.12

(58) Field of Classification Search
None
See application file for complete search history.

(56) References Cited

U.S. PATENT DOCUMENTS

| 6,344,953 | B1 | 2/2002 | Kautzky et al. | |
|---|---|---|---|---|
| 6,614,629 | B1 * | 9/2003 | Kakihara | 360/324.1 |
| 6,856,493 | B2 * | 2/2005 | Pinarbasi | 360/324.11 |
| 6,979,500 | B2 * | 12/2005 | Hasegawa et al. | 428/811.2 |
| 7,008,703 | B2 * | 3/2006 | Hasegawa et al. | 428/811.5 |
| 7,029,771 | B2 * | 4/2006 | Hasegawa et al. | 428/811.5 |
| 7,045,224 | B2 * | 5/2006 | Hasegawa et al. | 428/811.5 |
| 7,193,821 | B2 * | 3/2007 | Miyauchi | 360/324.1 |
| 7,229,706 | B2 * | 6/2007 | Hasegawa et al. | 428/811.5 |
| 7,248,449 | B1 | 7/2007 | Seagle | |
| 7,719,802 | B2 | 5/2010 | Kautzky et al. | |
| 7,835,116 | B2 | 11/2010 | Xue et al. | |
| 8,582,249 | B2 * | 11/2013 | Sapozhnikov et al. | 360/324.11 |
| 2003/0035256 | A1 * | 2/2003 | Hayashi et al. | 360/324.12 |
| 2004/0061986 | A1 * | 4/2004 | Kagami et al. | 360/324.11 |
| 2005/0264956 | A1 * | 12/2005 | Lee et al. | 360/324.12 |
| 2006/0007605 | A1 | 1/2006 | Li et al. | |
| 2007/0035893 | A1 | 2/2007 | Freitag et al. | |

(Continued)

FOREIGN PATENT DOCUMENTS

WO     00/34946 A1     6/2000
WO     2005/101375 A1  10/2005

OTHER PUBLICATIONS

European Search Report, EP 13166065, Sep. 27, 2013, 10 pages.

Primary Examiner — Kevin Bernatz
(74) Attorney, Agent, or Firm — HolzerIPLaw, PC

(57) ABSTRACT

A stack having a seed layer structure with a first part having a first cross-track width and a free layer deposited over the seed layer structure and with a second cross-track width, wherein the first cross-track width is greater than the second cross-track width. In one implementation, the seed layer structure further comprises an antiferromagnetic (AFM) layer and a synthetic antiferromagnetic (SAF) layer. In one alternate implementation, the cross-track width of the seed layer structure is substantially equal to the combined cross-track width of the free layer and cross-track width of two permanent magnets.

16 Claims, 11 Drawing Sheets

(56) References Cited

U.S. PATENT DOCUMENTS

| | | | |
|---|---|---|---|
| 2007/0133133 A1* | 6/2007 | Freitag et al. | ............ 360/324.12 |
| 2007/0253117 A1 | 11/2007 | Takei et al. | |
| 2008/0239582 A1 | 10/2008 | Kanaya et al. | |
| 2008/0253036 A1 | 10/2008 | Kagami et al. | |
| 2009/0040660 A1* | 2/2009 | Kagami et al. | ................ 360/319 |
| 2009/0122450 A1 | 5/2009 | Wang et al. | |
| 2011/0007427 A1 | 1/2011 | Qiu et al. | |

* cited by examiner

STACK WITH WIDE SEED LAYER

BACKGROUND

In a magnetic data storage and retrieval system, a magnetic read/write head includes a reader portion having a magnetoresistive (MR) sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information to recover the information encoded on the disc.

SUMMARY

Implementations described and claimed herein provide a stack having a seed layer structure with a first part having a first cross-track width and a free layer deposited over the seed layer structure and with a second cross-track width, wherein the first cross-track width is greater than the second cross-track width. In one alternate implementation, the cross-track width of the seed layer structure is substantially equal to combined cross-track width of the free layer and cross-track width of two permanent magnets.

The details of one or more embodiments of the invention are set forth in the accompanying drawings and the description below. These and various other features and uses will be apparent from a reading of the following detailed description.

BRIEF DESCRIPTIONS OF THE DRAWINGS

DETAILED DESCRIPTIONS

Figure 1:
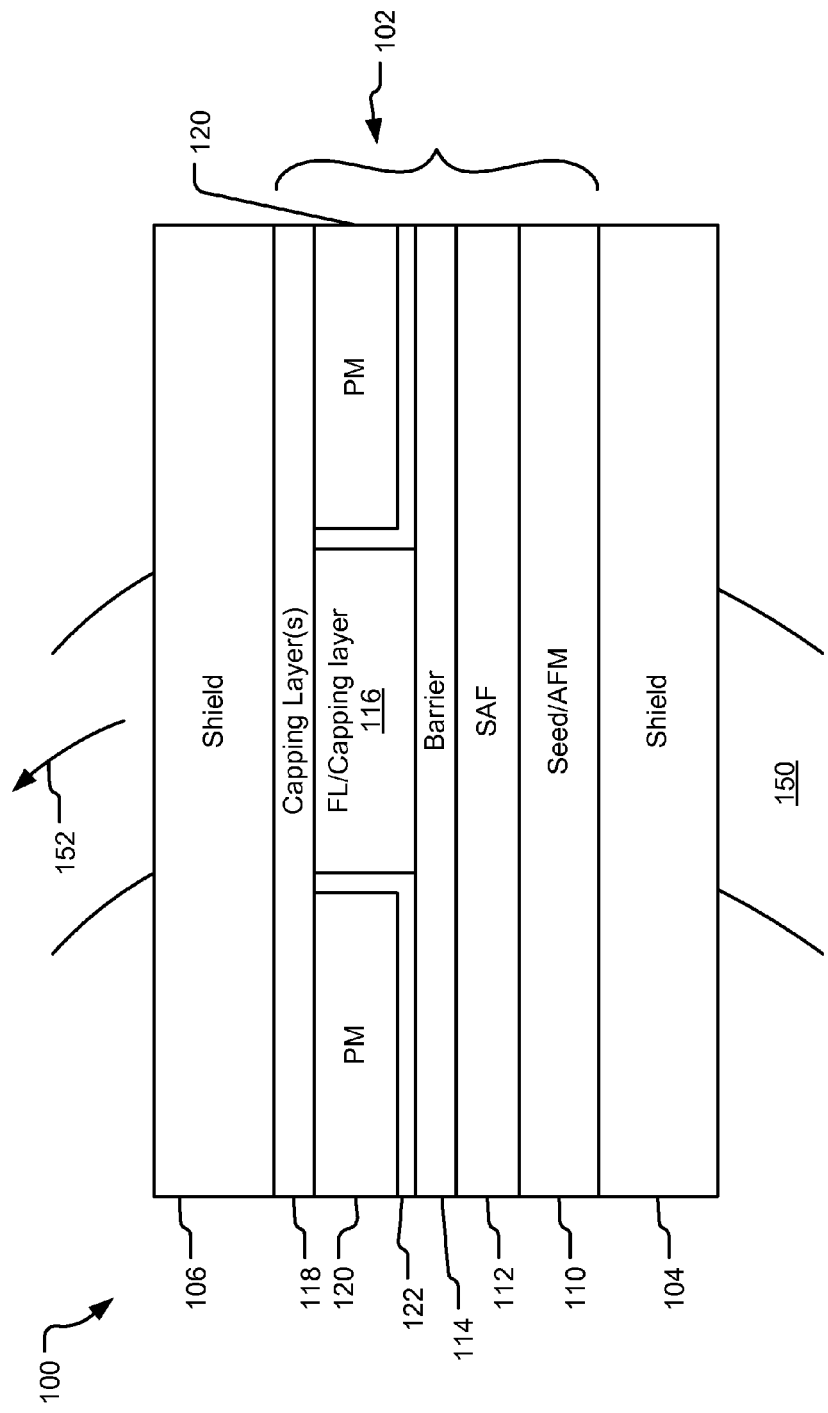
FIG. 1 illustrates a schematic block diagram illustrating an example read head including a magnetoresistive sensor.

There is an increasing demand for high data densities and sensitive sensors to read data from a magnetic media. Giant Magnetoresistive (GMR) sensors that have increased sensitivity consist of two soft magnetic layers separated by a thin conductive, non-magnetic spacer layer such as copper. Tunnel Magnetoresistive (TMR) sensors provide an extension to GMR in which the electrons travel with their spins oriented perpendicularly to the layers across a thin insulating tunnel barrier. An antiferromagnetic (AFM) material (called the "pinning layer (PL)") is placed adjacent to the first soft magnetic layer to prevent it from rotating. AFM materials exhibiting this property are termed "pinning materials". With its rotation inhibited, the first soft layer is termed the "pinned layer". The second soft layer rotates freely in response to an external field and is called the "free layer (FL)."

To operate the MR sensor properly, the sensor be stabilized against the formation of edge domains because domain wall motion results in electrical noise that makes data recovery difficult. A common way to achieve stabilization is with a permanent magnet abutted junction design. In this scheme, permanent magnets with high coercive field (i.e., hard magnets) are placed at each end of the sensor. The field from the permanent magnets stabilizes the sensor and prevents edge domain formation, as well as provides proper bias. In order to increase the stiffness of the PL, synthetic antiferromagnet" (SAF) is used in the PL. The use of the AFM/PL allows for consistent and predictable orientation of the SAF structure. Furthermore, the use of AFM/PL also provides stable structure to enable high amplitude linear response for a reader using the MR sensor.

However, using the AFM/PL structure increases the shield-to-shield spacing (SSS) of the reader. As the pulse width fluctuations PW50 of magnetic sensors, which determine the signal-to-noise (SNR) ratio in a recording system depends on the SSS of the header, achieving a lower SSS allows reducing the SNR of the recording system. An example of the relationship between the PW50 and SSS, as suggested by both modeling and experiments can be given as follows:

$$\Delta PW50 \approx 0.3 * \Delta SSS$$

Thus, a reduction in the SSS leads to reduction in the value of the PW50 and therefore, an increase in the value of the SNR for the recording system. Thus, higher linear density of the reader can be achieved by reducing the SSS. Furthermore, smaller SSS also improves the cross-track resolution of the media reader and such reduction in cross-track resolution contributes to further improvement of the areal density that can be achieved by the media reader.

The sensor stack assembly disclosed herein provides for reduced SSS for a reader. Specifically, the sensor stack includes an SAF/AFM structure with wide areal extent relative to the free layer FL. The decreased SSS leads to decreased pulse width and therefore, increase in the linear density capability of the reader using such AFM/PL structure. Furthermore, decreasing the SSS also improves the cross-track resolution of the reader and thus improves the areal density capability of the reader.

Furthermore, the magnetic dispersion of the AFM/PL system also contributes to magnetic noise that is dominant in various readers. Elimination of the AFM enables the PL magnetics to be optimized for soft, uniaxial properties, leading to noise-reduction. On the other hand, an AFM/PL system allows for consistent and predictable orientation of the SAF structure. The sensor stack assembly disclosed herein provides an SAF/AFM structure that has a wide areal extent relative to a free layer (FL). In one implementation of the sensor stack assembly, the SAF/AFM width is congruent with an abutted permanent magnet (PM).

An alternative implementation of the sensor stack assembly disclosed herein includes an SAF/AFM structure where the height of the SAF/AFM stripe is longer than the width of the SAF/AFM stripe (thus having a high aspect ratio). In another alternative implementation, the AFM is removed from regions directly adjacent to regions of the sensor including the FL, however, the AFM is present in areas wide of the FL (that is regions away from the FL). Such an implementation provides a stable SAF configuration and a reduction in SSS, resulting in PW50 improvement. In yet alternative implementation, the FL and the SAF are decoupled from each other using a barrier layer.

In another alternative implementation, the height of the AFM is greater than the width of the FL (the height of the AFM may be less than the width of the AFM). For example, in such an implementation, the AFM is removed from the area directly below the FL. Such an implementation provides favorable AFM shape anisotropy due to the height of the AFM being greater than the width of the AFM for various individual AFM sections even where the height of the AFM section is less than the total width of two AFM sections combined.

FIG. 1 illustrates a schematic block diagram illustrating an example read head 100 including a magnetoresistive sensor 102. An implementation of the sensor 100 can be used with magnetic read/write head in a disc drive. The read head 100 utilizes magnetoresistance to read data from the data discs in the disc drive. While the precise nature of the read head 100 may vary widely, a tunneling magneto-resistive (MR) read head 100 is described as one example of a read head 100 that can be utilized with an SAF and seed layers described herein. However, the SAF and the seed layers may be used in any useful read head 100, such as, for example, a current perpendicular-to-the-plane (CPP) giant magneto-resistive head, a giant magneto-resistive head, or the like.

In one implementation, the read head 100 flies over the surface of the disc drive data discs on an air bearing created by the rotation of the data discs. The data discs have a plurality of data tracks 150, one of which is shown in FIG. 1. The tracks 150 are divided into a plurality of bits. As the disc rotates in the direction of the arrow 152, the read head 100 follows a data track 150 and reads one or more bits as it passes under magnetoresistive sensor 102.

The read head 100 includes a first shield layer 104 and a second shield layer 106. The magnetoresistive sensor 102 is positioned between the first shield layer 104 and the second shield layer 106. The first and second shield layers 104, 106, which are made of a material having high magnetic permeability, reduce or substantially block extraneous magnetic fields, such as, for example, those from adjacent bits on data discs from impacting the magnetoresistive sensor 102, thus improving the performance of the magnetoresistive sensor 102. In one implementation, the first and second shield layers 104, 106 permit magnetic fields from the bit directly under magnetoresistive sensor 102 to affect the magnetoresistive sensor 102, and thus be read. Therefore, as the physical size of bits continues to decrease, the shield-to-shield spacing (SSS) should also be decreased.

The magnetoresistive sensor 102 includes a plurality of layers including an antiferromagnetic (AFM) seed layer 110, synthetic antiferromagnetic (SAF) layer 112, a tunneling barrier layer 114, a free layer 116, and a capping layer 118. In one implementation, the AFM layer 110 is electrically coupled to a first electrode and the cap layer 118 is electrically coupled to a second electrode. In one implementation of the magnetoresistive sensor 102, the free layer 116 also includes a second cap layer that is located between a pair of permanent magnets 120.

In an implementation, the SAF layer 112 includes a pinned layer and the reference layer. The magnetic moments of each of the pinned layer and the reference layer are not allowed to rotate under magnetic fields in the range of interest (e.g., magnetic fields generated by the bits of data stored on the data discs). The magnetic moments of the reference layer and the pinned layer are generally oriented normal to the plane of FIG. 1 and anti-parallel to each other.

In one implementation, the free layer 116 is not exchange coupled to an antiferromagnet. As a result, the magnetic moment of the free layer 116 is free to rotate under the influence of an applied magnetic field in a range of interest. The read head 100 further includes the pair of permanent magnets (PM) 120, which produce a magnetic field that biases the free layer 116 with a magnetic moment parallel to the plane of the figure and generally oriented horizontally. This bias prevents the magnetic moment of the free layer 116 from drifting due to, for example, thermal energy, which may introduce noise into the data sensed by the read head 100. The bias is sufficiently small, however, that the magnetic moment of the free layer 116 can change in response to an applied magnetic field, such as a magnetic field of a data bit stored on the data discs. The magnetoresistive sensor 102 is separated and electrically isolated from the permanent magnets 120 by an isolation layer 122 including insulating materials.

The tunneling barrier layer 114 separates the SAF 112 and the free layer 116. The tunneling barrier layer 114 is sufficiently thin that quantum mechanical electron tunneling occurs between a reference layer in the SAF 112 and the free layer 116. The electron tunneling is electron-spin dependent, making the magnetic response of the magnetoresistive sensor 102 a function of the relative orientations and spin polarizations of the SAF 112 and the free layer 116. The highest probability of electron tunneling occurs when the magnetic moments of the SAF 112 and the free layer 116 are parallel, and the lowest probability of electron tunneling occurs when the magnetic moments of the SAF 112 and the free layer 116 are antiparallel. Accordingly, the electrical resistance of the magnetoresistive sensor 102 changes in response to an applied magnetic field. The data bits on the data discs in the disc drive are magnetized in a direction normal to the plane of FIG. 1, either into the plane of the figure, or out of the plane of the figure. Thus, when the magnetoresistive sensor 102 passes over a data bit, the magnetic moment of the free layer 116 is rotated either into the plane of FIG. 1 or out of the plane of FIG. 1, changing the electrical resistance of the magnetoresistive sensor 102. The value of the bit being sensed by the magnetoresistive sensor 102 (e.g., either 1 or 0) may therefore be determined based on the current flowing from the first electrode to the second electrode connected to the magnetoresistive sensor 102.

To increase the storage capacity of a magnetic data storage device such as a disc drive, the size of the magnetically oriented domains (bits) on the data discs is continually being made smaller to produce higher data densities. Accordingly, the size of read head 100 may be made smaller, and particularly, the shield-to-shield spacing (SSS) may be decreased, so that the magnetoresistive sensor 102 is substantially isolated from the magnetic fields of adjacent bits on data track 150. To reduce the SSS, in an implementation of the magnetoresistive sensor 102, the cross-track width of the seed/AFM layer 110 and the SAF layer 112 is greater than the cross-track width of the free layer 116. In an alternate implementation, the cross-track width of a seed layer structure, including the AFM layer 110 and the SAF layer 112, is greater than the cross-track width of the free layer 116. For the magnetoresistive sensor 102 illustrated in FIG. 1, the cross-track width of the AFM layer 110 and the SAF layer is substantially similar. Moreover, the cross-track width of the AFM layer 110 and the SAF layer is substantially similar to the combined cross-track width of the free layer 116 and the permanent magnets 120.

While the implementation illustrated in FIG. 1 shows the cross-track width of the entire AFM layer 110 to be substantially greater than the cross-track width of the free layer 116, in an alternate implementation, part of the AFM layer 110 has cross-track width that is greater than the cross-track width of the free layer 116. For example, in such an implementation, the AFM layer 110 may be graded (not shown) with at least part of the AFM layer 110 having a cross-track width that is substantially similar to the cross-track width of the free layer 116. For example, in one implementation, the cross-track width of the AFM layer 110 in proximity to the SAF layer 112 is greater than the cross-track width of the AFM layer 110 in proximity to the shield 104, or vice-versa. Similarly, in an alternate implementation, part of the SAF layer 112 has a cross-track width that is greater than the cross-track width of the free layer 116. For example, in such an implementation, the SAF layer 112 may be graded (not shown) with at least part of the SAF layer 112 having a cross-track width that is substantially similar to the cross-track width of the free layer 116. In yet alternate implementation of the magnetoresistive sensor 102, the height of the seed layer structure (combined AFM layer 110 and the SAF layer 112) is greater than the cross-track width of the seed layer structure. In the illustrated implementation, the height of the seed layer structure is represented by the depth into the surface of FIG. 1.

Figure 2:
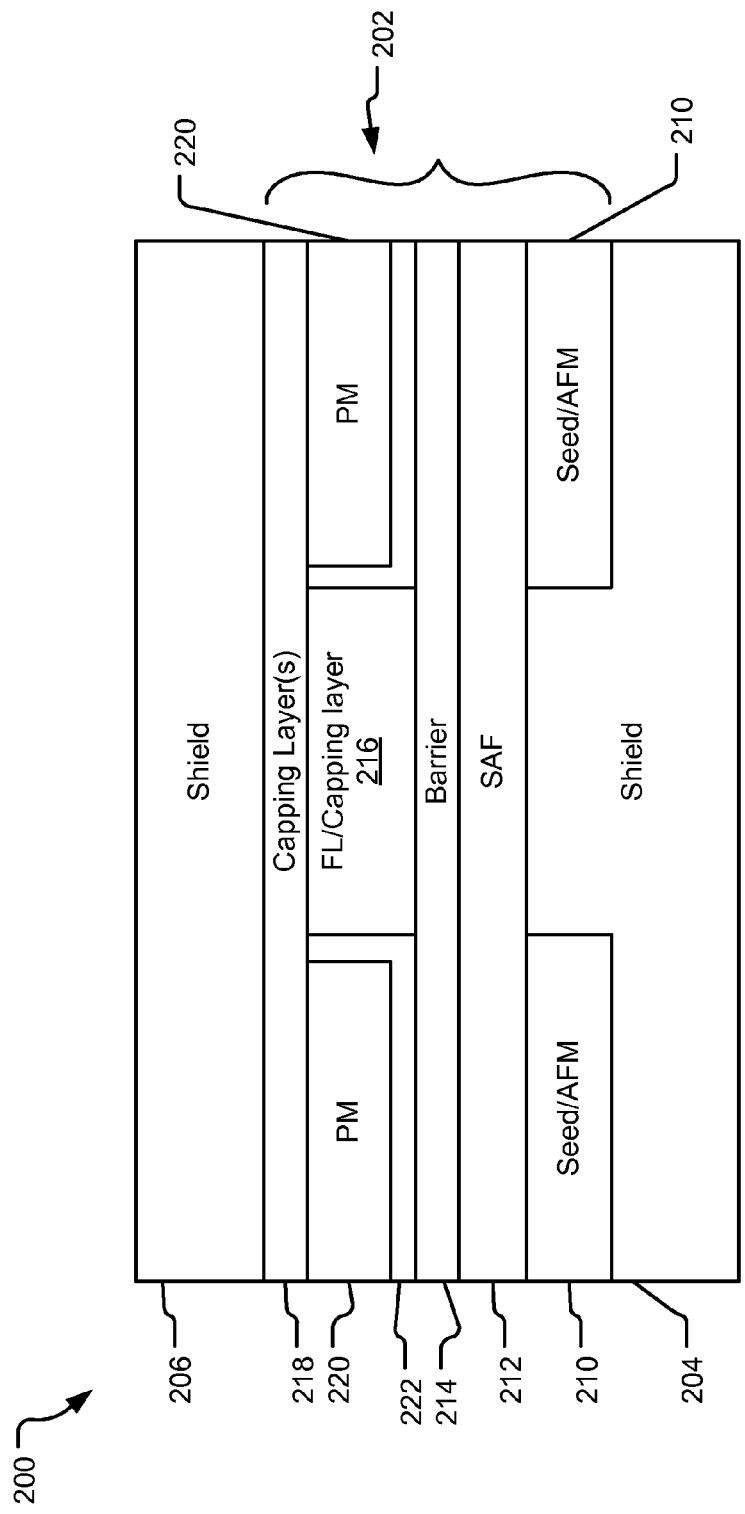
FIG. 2 illustrates an alternative schematic block diagram illustrating an example read head including a magnetoresistive sensor.

FIG. 2 illustrates an alternative schematic block diagram illustrating an example read head 200 including a magnetoresistive sensor 202. In the illustrated implementation, many aspects of the read head 200 are substantially similar to the corresponding aspects of the read head 100. For example, the read head 200 includes a first shield layer 204 and a second shield layer 206. The magnetoresistive sensor 202 is positioned between the first shield layer 204 and the second shield layer 206. The magnetoresistive sensor 202 includes a plurality of layers including an antiferromagnetic (AFM) seed layer 210, synthetic antiferromagnetic (SAF) layer 212, a tunneling barrier layer 214, a free layer 216, and a capping layer 218. In one implementation, the AFM layer 210 is electrically coupled to a first electrode and the cap layer 218 is electrically coupled to a second electrode. In one implementation of the magnetoresistive sensor 202, the free layer 216 also includes a second cap layer that is located between a pair of permanent magnets 220.

In an implementation, the SAF layer 212 includes a pinned layer and the reference layer. The magnetic moments of each of the pinned layer and the reference layer are not allowed to rotate under magnetic fields in the range of interest (e.g., magnetic fields generated by the bits of data stored on the data discs). The magnetic moments of the reference layer and the pinned layer are generally oriented normal to the plane of FIG. 2 and anti-parallel to each other.

In one implementation, the free layer 216 is not exchange coupled to an antiferromagnet. As a result, the magnetic moment of the free layer 216 is free to rotate under the influence of an applied magnetic field in a range of interest. The read head 200 further includes the pair of permanent magnets (PM) 220, which produce a magnetic field that biases the free layer 216 with a magnetic moment parallel to the plane of the figure and generally oriented horizontally. This bias prevents the magnetic moment of the free layer 216 from drifting due to, for example, thermal energy, which may introduce noise into the data sensed by the read head 200. The bias is sufficiently small, however, that the magnetic moment of the free layer 216 can change in response to an applied magnetic field, such as a magnetic field of a data bit stored on the data discs. The magnetoresistive sensor 202 is separated and electrically isolated from the permanent magnets 220 by an isolation layer 222 including insulating materials.

The tunneling barrier layer 214 separates the SAF 212 and the free layer 216. The tunneling barrier layer 214 is sufficiently thin that quantum mechanical electron tunneling occurs between a reference layer in the SAF 212 and the free layer 216. The electron tunneling is electron-spin dependent, making the magnetic response of the magnetoresistive sensor 202 a function of the relative orientations and spin polarizations of the SAF 212 and the free layer 216. The highest probability of electron tunneling occurs when the magnetic moments of the SAF 212 and the free layer 216 are parallel, and the lowest probability of electron tunneling occurs when the magnetic moments of the SAF 212 and the free layer 216 are antiparallel. Accordingly, the electrical resistance of the magnetoresistive sensor 202 changes in response to an applied magnetic field. The data bits on the data discs in the disc drive are magnetized in a direction normal to the plane of FIG. 2, either into the plane of the figure, or out of the plane of the figure. Thus, when the magnetoresistive sensor 202 passes over a data bit, the magnetic moment of the free layer 216 is rotated either into the plane of FIG. 2 or out of the plane of FIG. 2, changing the electrical resistance of the magnetoresistive sensor 202. The value of the bit being sensed by the magnetoresistive sensor 202 (e.g., either 1 or 0) may therefore be determined based on the current flowing from the first electrode to the second electrode connected to the magnetoresistive sensor 202.

To increase the storage capacity of a magnetic data storage device such as a disc drive, the size of the magnetically oriented domains (bits) on the data discs is continually being made smaller to produce higher data densities. Accordingly, the size of read head 200 may be made smaller, and particularly, the shield-to-shield spacing (SSS) may be decreased, so that the magnetoresistive sensor 202 is substantially isolated from the magnetic fields of adjacent bits on data track.

To improve the SNR by reducing the noise, in an implementation of the magnetoresistive sensor 202, the cross-track width of the seed/AFM layer 210 and the SAF layer 212 is greater than the cross-track width of the free layer 216. Specifically, the increased width of the SAF/AFM structure improves the stability of the magnetoresistive sensor 202, thus resulting in decreased noise. In an alternative implementation, the cross-track width of a seed layer structure, including the AFM layer 210 and the SAF layer 212, is greater than the cross-track width of the free layer 216. For the magnetoresistive sensor 202 illustrated in FIG. 2, the cross-track width of the SAF layer 212 is substantially similar to the combined cross-track width of the free layer 116 and the permanent magnets 120. In an alternative implementation, in addition to having much wider SAF/AFM structure, the AFM region where the FL is located is also removed, or is graded, which results in reduced SSS. Thus, the combined structure with wide SAF/AFM structure and removed portion of AFM where FL is located results in reduced SSS as well as improved stability and reduced noise.

The AFM layer 210 of the read head 200 is configured such that the cross-track surface of the AFM layer 210 is substantially limited to the cross-track surface of the permanent magnets 220. For example, as shown in FIG. 2, the inner edge of the AFM layer 210 is substantially aligned with the inner edge of the permanent magnets 220. Such structure of the AFM layer 210 allows the magnetoresistive sensor 202 to be constructed with lower shield-to-shield spacing (SSS).

While the implementation illustrated in FIG. 2 shows the cross-track width of the entire AFM layer 210 to be substantially greater than the cross-track width of the free layer 216, in an alternate implementation, part of the AFM layer 210 has cross-track width that is greater than the cross-track width of the free layer 216. For example, in such an implementation, the AFM layer 210 may be graded (not shown) with at least part of the AFM layer 210 having a cross-track width that is substantially similar to the cross-track width of the free layer 216. Similarly, in an alternate implementation, part of the SAF layer 212 has a cross-track width that is greater than the cross-track width of the free layer 216. For example, in such an implementation, the SAF layer 212 may be graded (not shown) with at least part of the SAF layer 212 having a cross-track width that is substantially similar to the cross-track width of the free layer 216. In yet alternate implementation of the magnetoresistive sensor 202, the height of the seed layer structure (combined AFM layer 210 and the SAF layer 212) is greater than the cross-track width of the seed layer structure. In the illustrated implementation, the height of the seed layer structure is represented by the depth into the surface of FIG. 2.

In one alternative implementation of the read head 200, the section of the first shield 204 that is closer to the magnetoresistive sensor 202 has a width that is equal to the width of the magnetoresistive sensor 202. However, in alternative implementations, the width of the section of the first shield 204 that is closer to the magnetoresistive sensor 202 has a width that is smaller or larger than the width of the magnetoresistive sensor 202. The ratio of the width of the first shield 204 section closer to the magnetoresistive sensor 202 and the width of the magnetoresistive sensor 202 affects the stability of the SAF and the effective SSS. In other words, the ratio allows a designer to trade off between the stability of the SAF and effective reduction in the SSS. The smaller the width of the section of the first shield 204 that is closer to the magnetoresistive sensor 202, the higher is the SAF stability and higher is the effective SSS, and vice-versa.

The implementation of the magnetoresistive sensors 102 and 202 eliminates the problems related to cutting the AFM grains and thus creating extra small AFM grains in the process of AFM patterning. These reduced-size grains are small and often unstable. The AFM grains for the proposed implementation of the magnetoresistive sensors 102 and 202 are cut far away from the free layers so that the reduced-size AFM grain instability does not affect the magnetoresistive sensors 102 and 202. Furthermore, the thinner permanent magnets 120 and 220 creates less SAF bias, therefore, reducing the permanent magnet torque on the SAF and thus allowing balancing the SAF to make it more stable. The implementation of the magnetoresistive sensor 202 additionally reduces the shield-to-shield spacing (SSS) at the free layer 216, thus improving PW50 by 0.3*AFM.

FIGS. 3-9 illustrate various stages of manufacturing an example read head including a magnetoresistive sensor. An implementation of the method for forming the magnetoresistive sensor includes techniques such as masking layers and ion-milling for removal of previously deposited material. Additionally, endpoint detection techniques are used for removal of a free layer without the removal of SAF/AFM layers during the formation of the width of the reader to ensure that SAF layers are not impacted. In an alternate implementation of the magnetoresistive sensor, the thickness of the PM is reduced relative to the other implementations of abutted junction sensor designs. Such implementation of the PM reduces the amount of flux available to stabilize the free layer (FL). Furthermore, in an alternative implementation, the thickness of the isolation layer between the PM and the FL is also substantially reduced.

Figure 3:
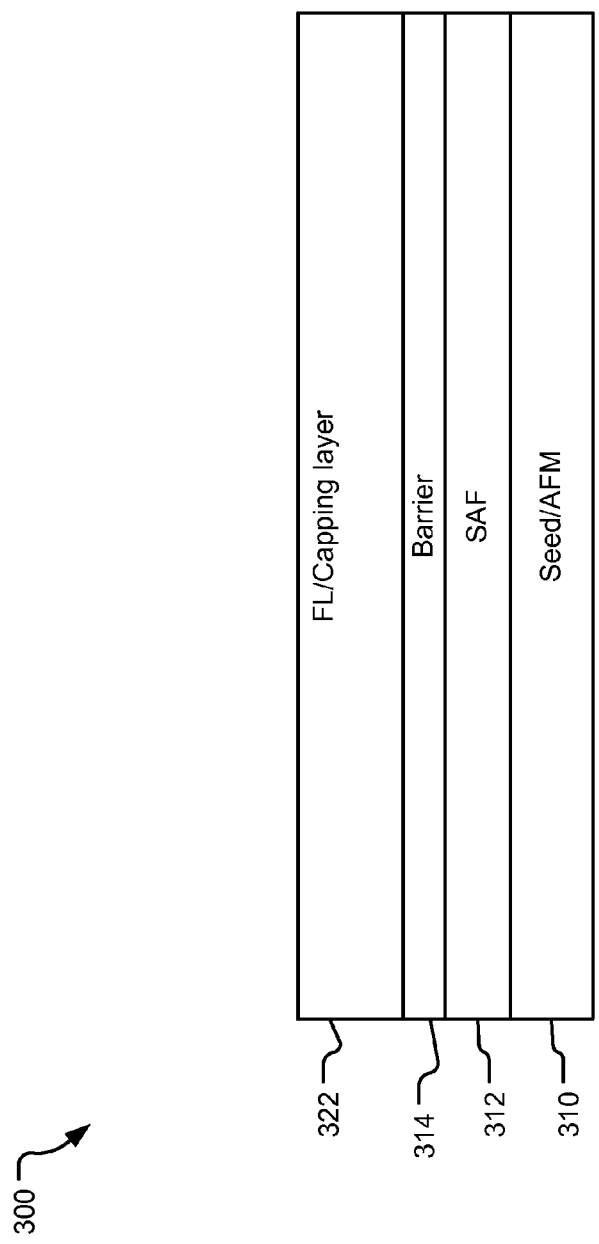
FIGS. 3-5 illustrate various stages of manufacturing an example read head including a magnetoresistive sensor.

Specifically, FIG. 3 illustrates an air bearing surface (ABS) view of layers of a magnetoresistive sensor stack 300 including a seed/AFM layer 310, an SF layer 312, a tunneling barrier layer 314, and a free layer 322. The magnetoresistive sensor stack 300 is used as the starting configuration for manufacturing a magnetoresistive sensor disclosed herein.

Figure 4:
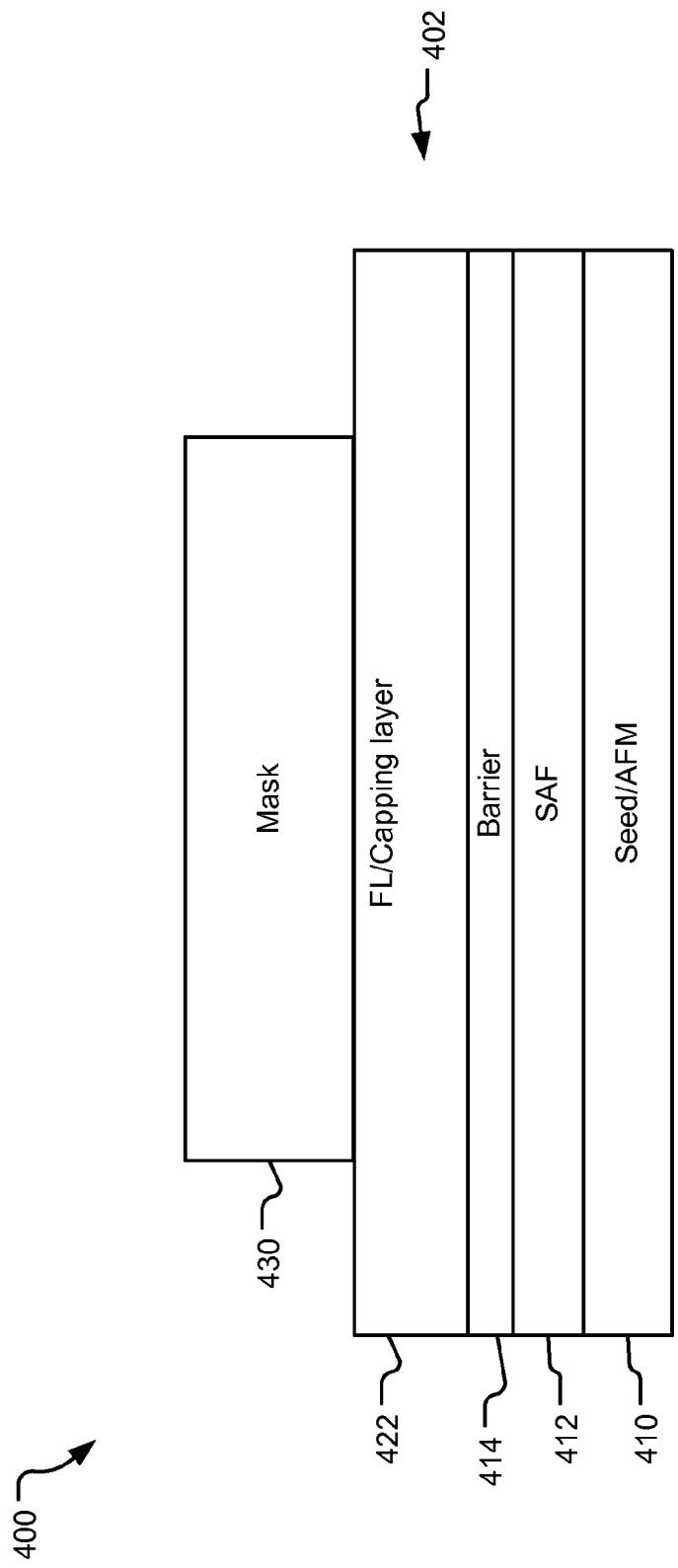

FIG. 4 illustrates the masking operation 400 where a mask 430 is provided on the free layer 422. The partially formed magnetoresistive sensor 402 includes a seed layer 410, an SAF layer 412, a barrier layer 414, and a free layer 422. As illustrated in FIG. 4, the mask 422 is deposited on a limited and center part of the free layer 422. In one implementation, the width of the masking layer 430 defines the reader width of the magnetoresistive sensor. In one alternative implementation, the mask 430 includes an image transfer layer and a layer of photoresist (not shown) deposited over the image transfer layer. The image transfer layer can be a soluble polymer such or some other similar, suitable material. Other masking layers, such as but not limited, to one or more hard mask layers, a bottom antireflective coating, and/or a release layer can also be provided in the mask 430.

Figure 5:
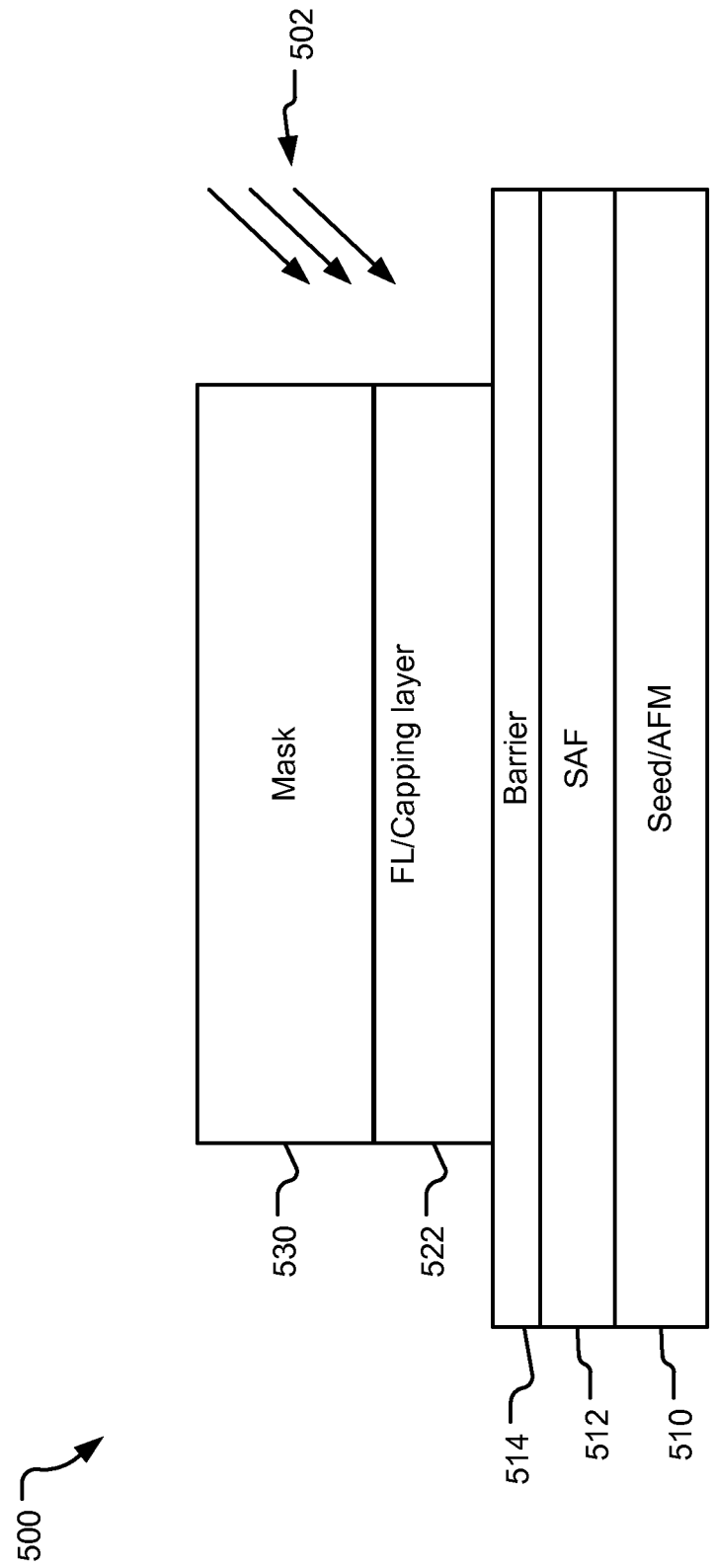

FIG. 5 illustrates a subsequent operation 500 for manufacturing a magnetoresistive sensor. Specifically, as illustrated in FIG. 5, a free layer 522 is further defined by ion milling and/or reactive etch operation 502. The etching of the free layer 522 exposes at least a part of a tunneling barrier layer 514 relative to the part of the free layer 522 that is not covered by a mask layer 530. In one implementation, the ion/milling and/or reactive etching operation 502 does not affect the SAF layer 512 and the AFM layer 510. In an alternative implementation, the ion milling and/or reactive etch operation 502 also removes the barrier layer 514 and the SAF layer 512 in regions where the free layer 522 is not covered by a mask layer 530.

Figure 6:
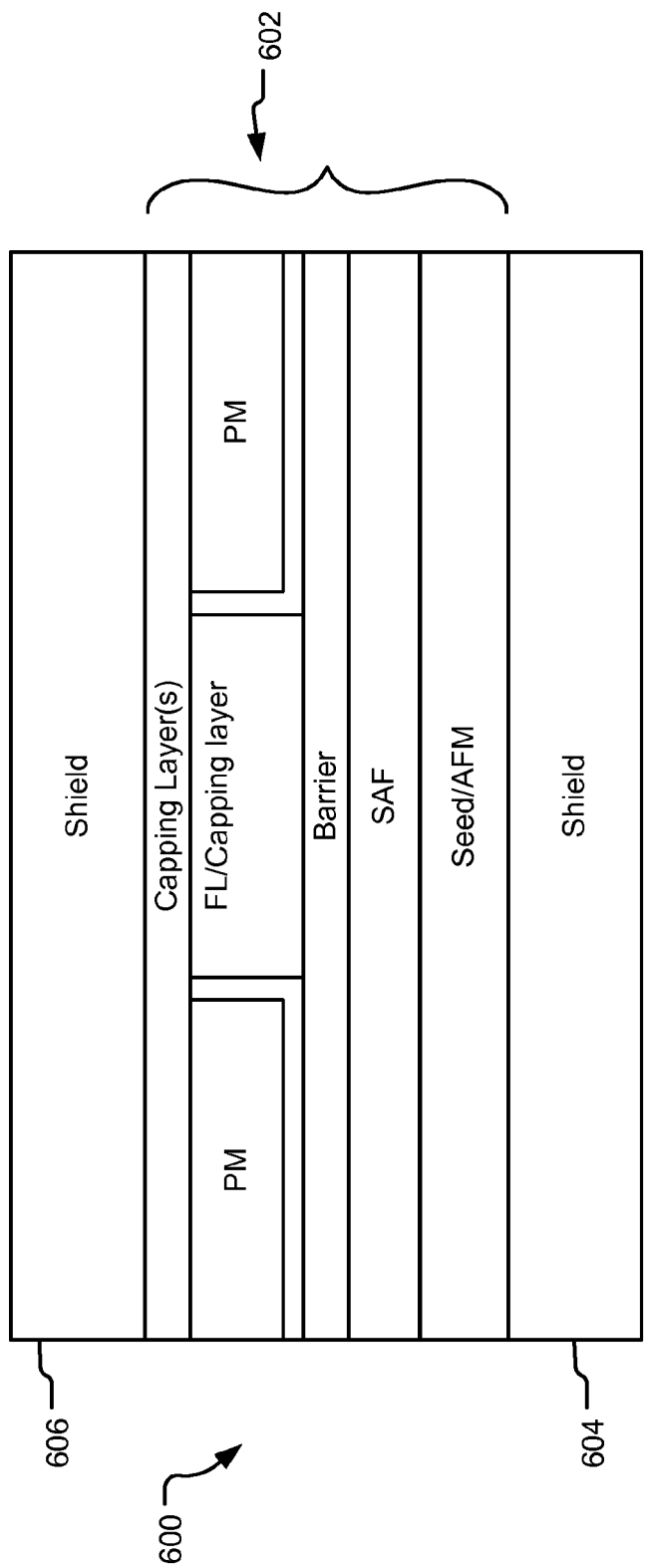
FIG. 6 illustrates an alternative schematic block diagram illustrating an example read head including a magnetoresistive sensor.

The magnetoresistive sensor resulting after the operation 500 is further processed using a series of operations, including depositing a PM, removing the mask 530, etc., to generate a magnetoresistive sensor 602 as illustrated in FIG. 6, which is substantially similar to the magnetoresistive sensor 102 illustrated in FIG. 1. Additionally, a bottom shield 604 and top shield 606 are added to manufacture a magnetic reader 600.

Figure 7:
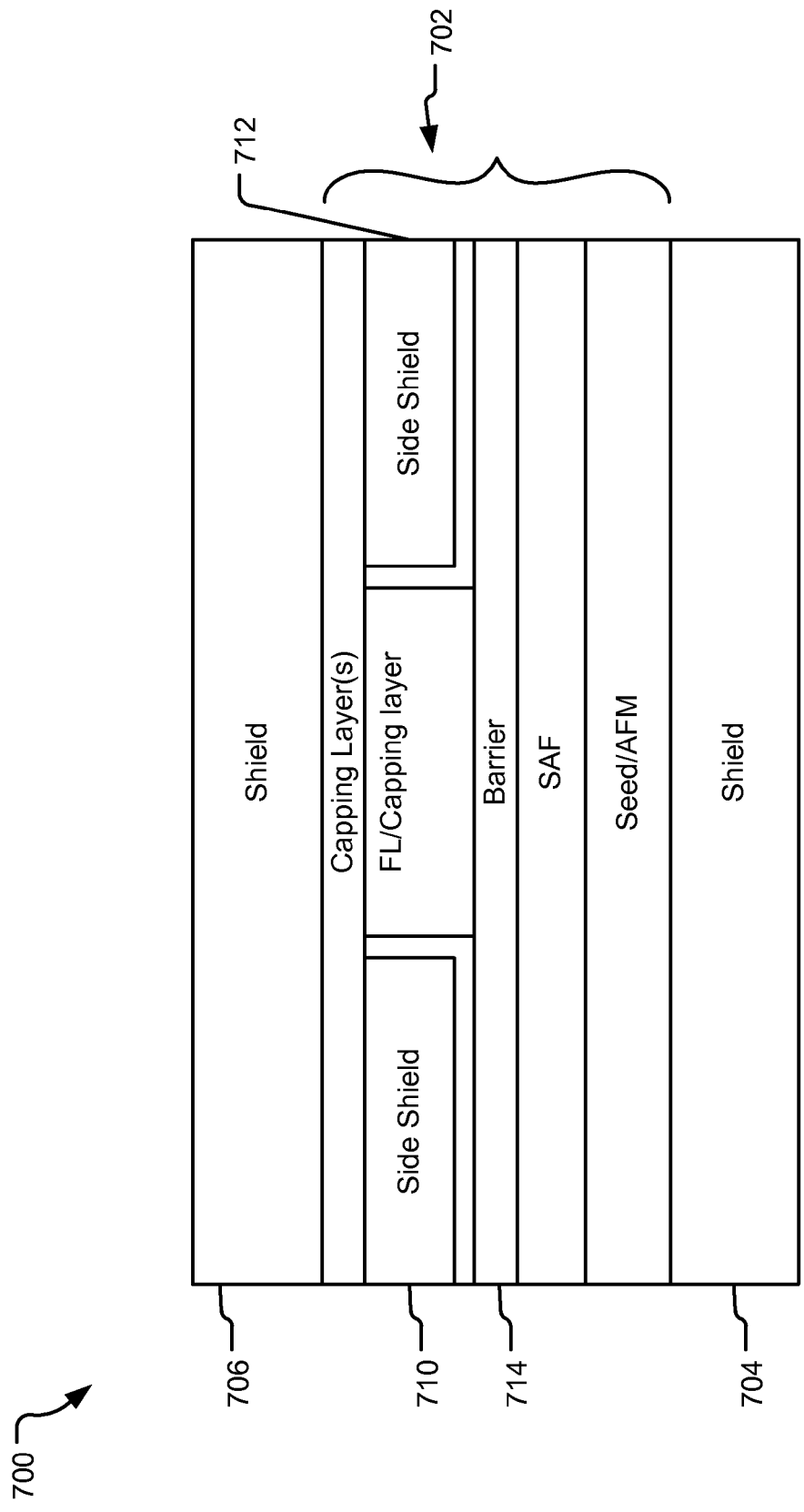
FIG. 7 illustrates an alternative schematic block diagram illustrating an example read head including a magnetoresistive sensor.

FIG. 7 illustrates an alternative schematic block diagram illustrating an example read head 700 including a magnetoresistive sensor 702. Specifically, the magnetoresistive sensor 702 includes a side shield 710 and a side shield 712 are located above a barrier layer 714. In one implementation, the side shields 710 and 712 are made of ferromagnetic material. Additionally, a bottom shield 704 and top shield 706 are added to manufacture the read head 700.

Figure 8:
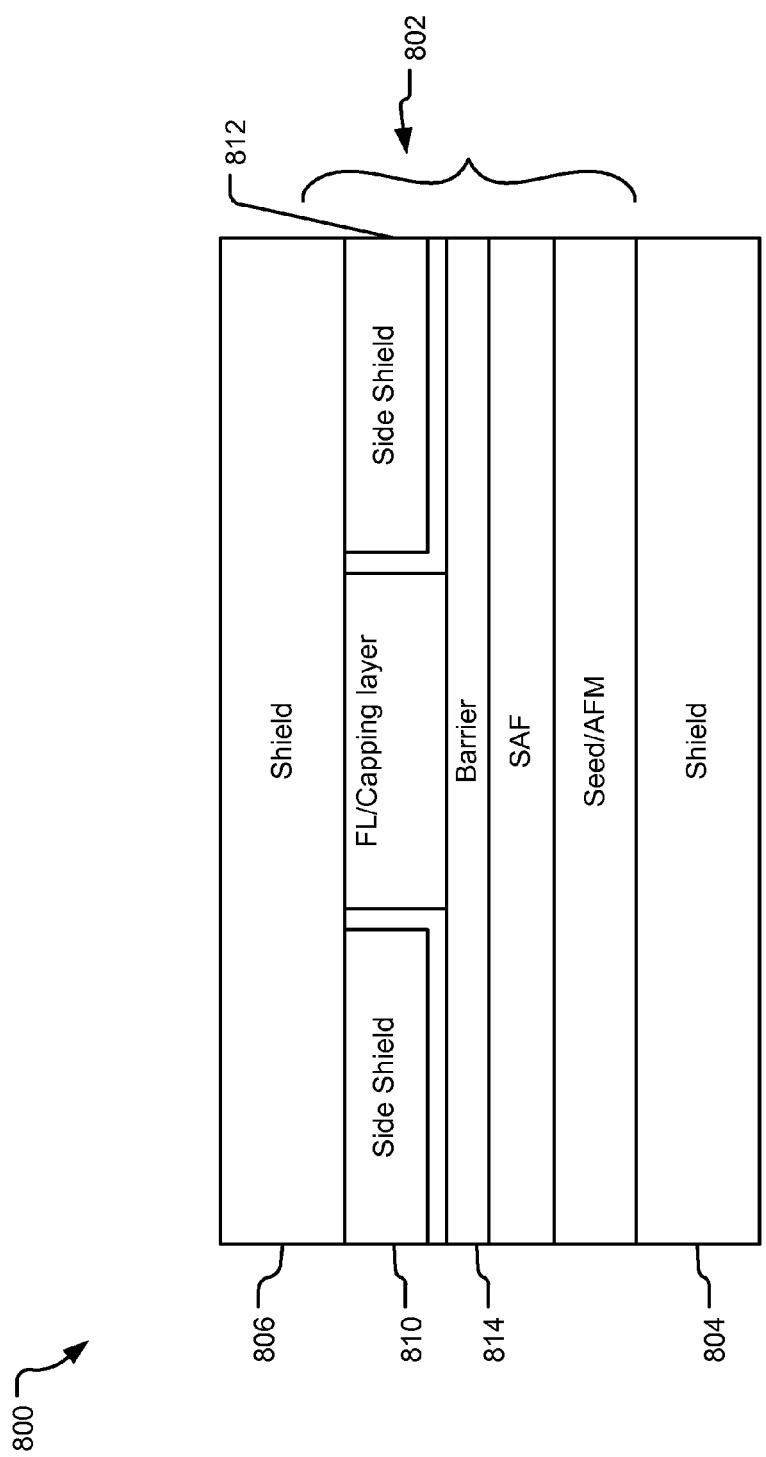
FIG. 8 illustrates an alternative schematic block diagram illustrating an example read head including a magnetoresistive sensor.

FIG. 8 illustrates an alternative schematic block diagram illustrating an example read head 800 including a magnetoresistive sensor 802. Specifically, the magnetoresistive sensor 802 includes a side shield 810 and a side shield 812 located above a barrier layer 814. Additionally, a bottom shield 804 and top shield 806 are added to manufacture the read head 800. In one implementation, the side shields 810 and 812 are made of ferromagnetic material and are adjacent to the top shield 806.

Figure 9:
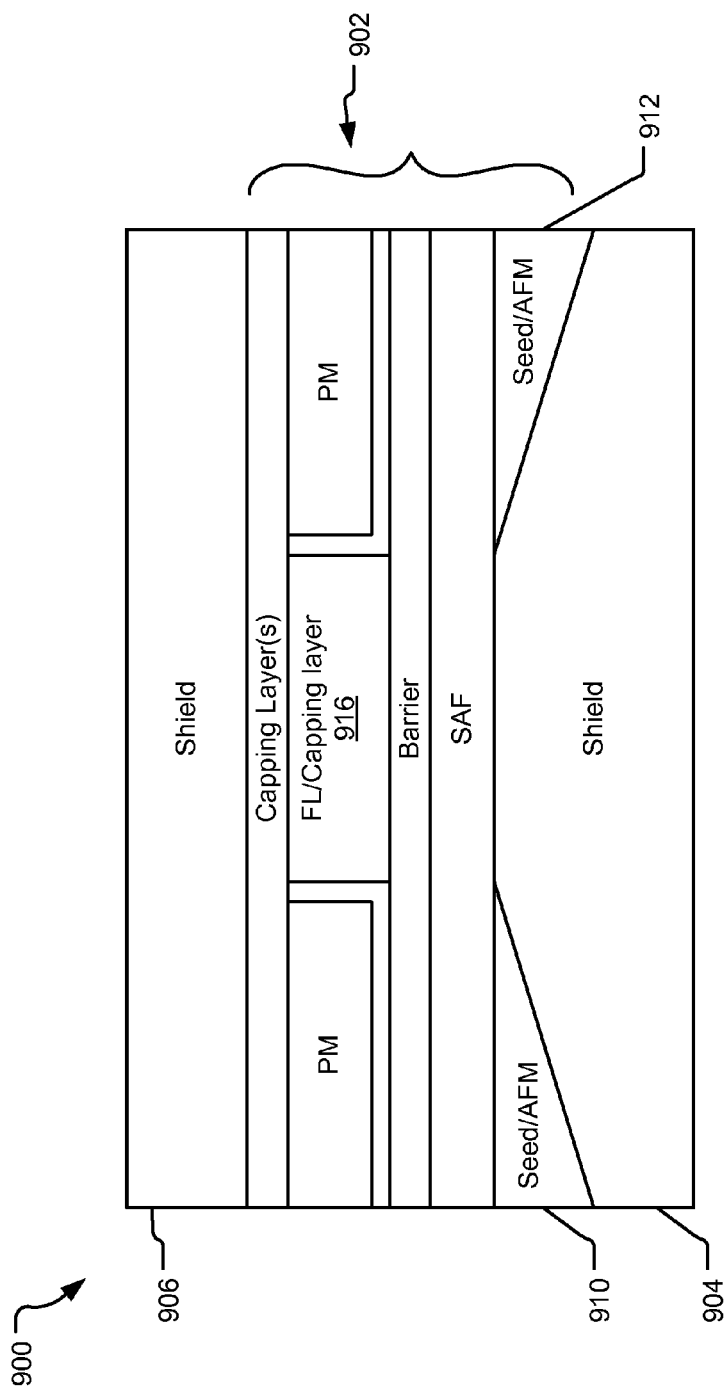
FIG. 9 illustrates an alternative schematic block diagram illustrating an example read head including a magnetoresistive sensor.

FIG. 9 illustrates an alternative schematic block diagram illustrating an example read head 900 including a magnetoresistive sensor 902. Additionally, a bottom shield 904 and top shield 906 are added to manufacture the read head 900. The magnetoresistive sensor 902 includes a first seed/AFM layer 910 and a second seed/AFM layer 912, where the seed/AFM layers 910 and 912 are graded such that at least part of the shield layer 904 has a cross-track width that is substantially similar to the cross-track width of the free layer 916. Thus, the seed/AFM layers 910 and 912 do not overlap the free layer 916. Such a structure may eliminate the problem of cutting the AFM layer grains and this creating extra small AFM grains in the process of AFM patterning. The reduced size grains are small and often unstable. The structure disclosed herein allows AFM grains to be cut far away from the free layer to reduce the instability associated with the reduced-size AFM grains.

Figure 10:
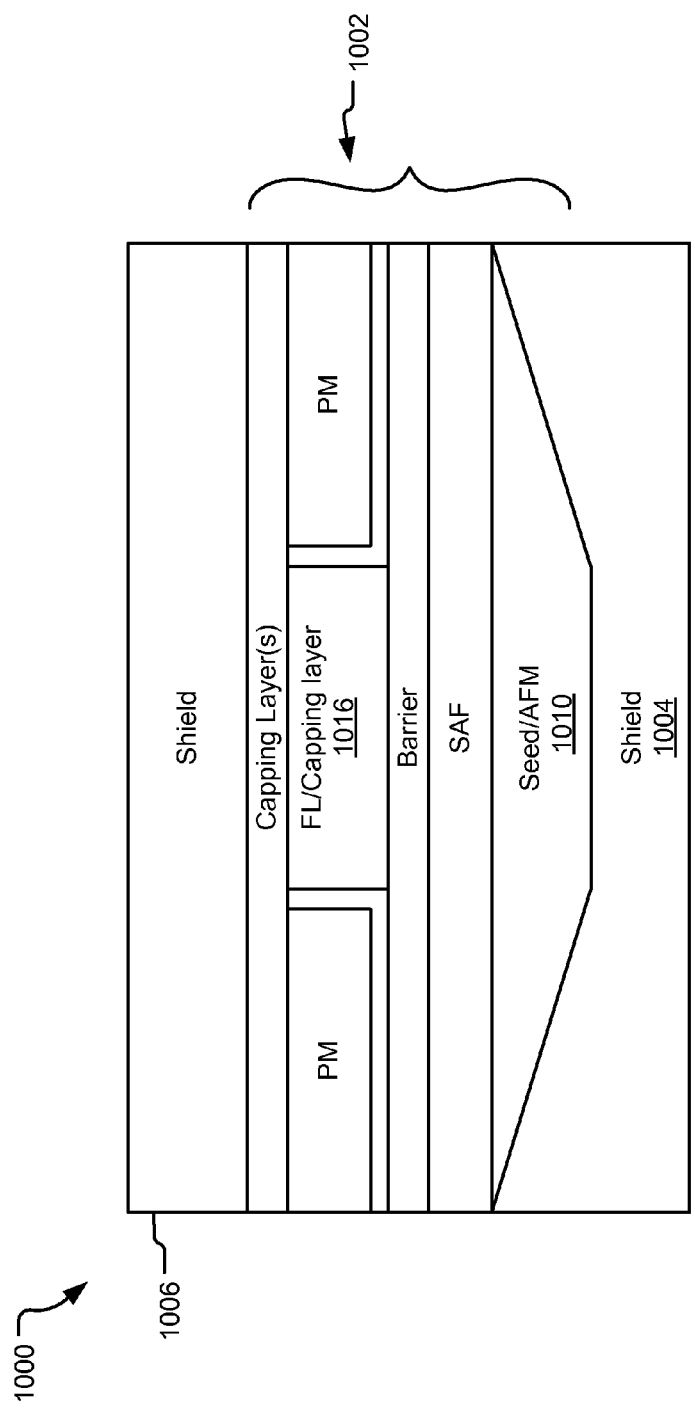
FIG. 10 illustrates an alternative schematic block diagram illustrating an example read head including a magnetoresistive sensor.

FIG. 10 illustrates an alternative schematic block diagram illustrating an example read head 1000 including a magnetoresistive sensor 1002. Additionally, a bottom shield 1004 and top shield 1006 are added to manufacture the read head 900. The magnetoresistive sensor 902 includes a seed/AFM layer 1010 where the seed/AFM layer 1010 has a trapezoidal shape with wider side close to the free layer 1016. Specifically, the seed/AFM layer 1010 is graded such that at least part of the seed/AFM layer 1010 has a cross-track width that is substantially similar to the cross-track width of the free layer 1016.

Figure 11:
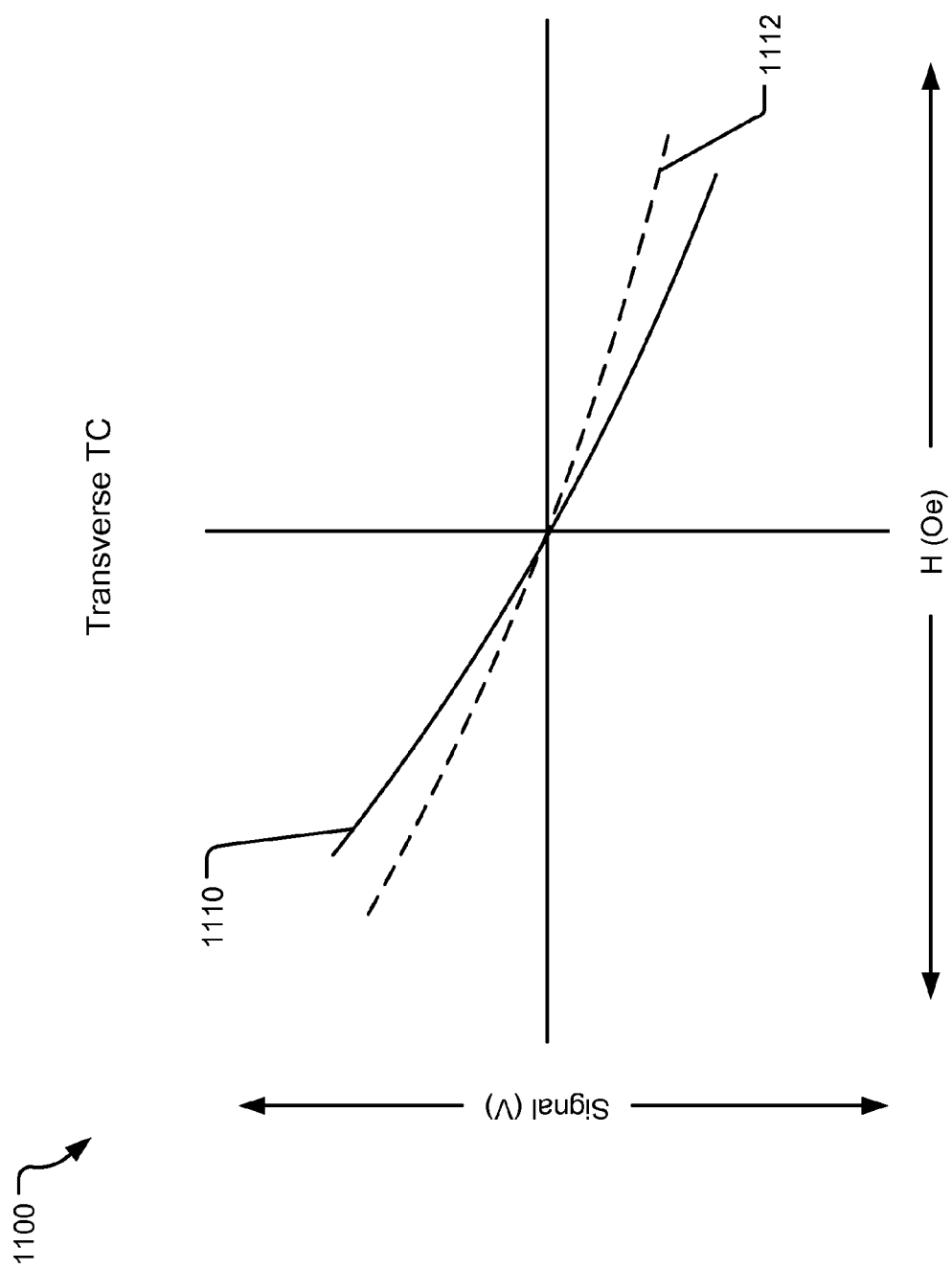
FIG. 11 illustrates example operations illustrating manufacturing a read head including a magnetoresistive sensor.

FIG. 11 illustrates a graph illustrating the asymmetry reduction that may be achieved by the read head including a magnetoresistive sensor. Specifically, FIG. 10 illustrates a graph of the transverse transfer curves of read heads. The solid curve 1110 illustrates a transverse transfer curve for a magnetoresistive sensor with SAF layer having cross-track width substantially similar to the cross-track width of a free layer. On the other hand, the dotted curve 1112 illustrates a transverse transfer curve for a magnetoresistive sensor with SAF layer having cross-track width substantially larger than the cross-track width of a free layer. As shown, there is substantial reduction in the asymmetry for a magnetoresistive sensor with wider SAF. Specifically, the solid curve 1110 illustrates a transfer curve for a stack that has SAF cross-track width of 40 nm and the PM cross-track width of 8 nm, resulting in asymmetry of approximately 14%. Compared to that, the dotted curve 1112 illustrates a transfer curve for a stack that has SAF cross-track width of 200 nm and the PM cross-track width of 8 nm, resulting in asymmetry of approximately 4%.

The above specification, examples, and data provide a complete description of the structure and use of example implementations of the invention. Since many implementations of the invention can be made without departing from the spirit and scope of the invention, the invention resides in the claims hereinafter appended. Furthermore, structural features of the different implementations may be combined in yet another implementation without departing from the recited claims. The implementations described above and other implementations are within the scope of the following claims.

What is claimed is:

1. A magnetoresistive sensor comprising:
a seed layer structure with a first part having a first cross-track width;
a free layer deposited over the seed layer structure and with a second cross-track width; and
wherein the seed layer structure comprises an antiferromagnetic (AFM) layer and the AFM layer and the free layer do not overlap in a cross-track direction and wherein the first cross-track width is greater than the second cross-track width.

2. The magnetoresistive sensor of claim 1 wherein a height of the seed layer structure is greater than the first cross-track width.

3. The magnetoresistive sensor of claim 1 wherein the free layer is located between two permanent magnets and wherein the first cross-track width is substantially equal to combined cross-track width of the two permanent magnets and the second cross-track width.

4. The magnetoresistive sensor of claim 1 further comprising two permanent magnets with the free layer in-between.

5. The magnetoresistive sensor of claim 1 wherein the first part of the seed layer structure is a synthetic antiferromagnetic (SAF) layer.

6. The magnetoresistive sensor of claim 1 wherein the antiferromagnetic (AFM) layer has tapered cross-track width.

7. The magnetoresistive sensor of claim 1 wherein the seed antiferromagnetic (AFM) layer has a trapezoidal shape.

8. A magnetoresistive sensor comprising:
a free layer between a first permanent magnet and a second permanent magnet;
an antiferromagnetic (AFM) layer structure, wherein the AFM layer structure does not overlap the free layer along the cross-track direction, wherein cross-track width of the AFM layer structure is substantially equal to combined cross-track width of the free layer and the permanent magnets.

9. The magnetoresistive sensor of claim 8 wherein the AFM layer structure further comprising:
a tunneling barrier layer located between combination of the free layer and the permanent magnets and the AFM layer structure;
a synthetic antiferromagnetic (SAF) layer adjacent to the tunneling barrier layer; and
a seed layer including AFM material.

10. The magnetoresistive sensor of claim 9 wherein at least part of the SAF layer being adjacent to a shield layer.

11. The magnetoresistive sensor of claim 10 wherein the cross-track width of the part of the SAF layer being adjacent to the shield layer is substantially equal to the cross-track width of the free layer.

12. The magnetoresistive sensor of claim 8 wherein a height of the AFM layer structure is greater than the cross-track width of the AFM layer structure.

13. The magnetoresistive sensor of claim 8 wherein a height of the AFM layer structure is greater than the cross-track width of the free layer.

14. The magnetoresistive sensor of claim 8 wherein cross-track width of at least a part of the AFM layer structure is greater than cross-track width of the free layer.

15. A magnetoresistive sensor comprising:
a free layer;
a synthetic antiferromagnetic (SAF) layer; and
an antiferromagnetic (AFM) layer structure, wherein the AFM layer structure is located on a shield layer with at least a part of the shield layer located between parts of the AFM layer structure along a cross-track direction, wherein cross-track width of at least a part of the AFM layer structure is greater than cross-track width of the free layer.

16. The magnetoresistive sensor of claim 15, wherein the free layer is located between a first permanent magnet and a second permanent magnet along a cross-track direction.

* * * * *